United States Patent [19]
Hedberg

[11] Patent Number: 5,216,682
[45] Date of Patent: Jun. 1, 1993

[54] LASER CONTROL METHOD AND APPARATUS

[75] Inventor: Mats O. J. Hedberg, Stockholm, Sweden

[73] Assignee: Telefonaktiebolaget LM Ericsson, Stockholm, Sweden

[21] Appl. No.: 835,626

[22] Filed: Feb. 13, 1992

[51] Int. Cl.[5] .................................. H01S 3/13
[52] U.S. Cl. ............................ 372/31; 372/26; 372/38
[58] Field of Search .............. 372/31, 29, 25, 26

[56] References Cited

U.S. PATENT DOCUMENTS

| | | | |
|---|---|---|---|
| 4,955,029 | 9/1990 | Lecoy et al. | 372/31 |
| 5,107,512 | 4/1992 | Shibutani | 372/32 |
| 5,123,023 | 6/1992 | Satarelli et al. | 372/31 |

*Primary Examiner*—Léon Scott, Jr.
*Attorney, Agent, or Firm*—Johnson & Gibbs

[57] ABSTRACT

An apparatus for controlling the optical output intensity of a laser diode includes mean and peak power regulating structure. A method for controlling the optical output intensity of a laser diode includes the steps of sensing both peak and mean power and regulating based upon what is sensed.

14 Claims, 3 Drawing Sheets

LASER CONTROL METHOD AND APPARATUS

BACKGROUND OF THE INVENTION

1. Field of the Invention

The present invention relates to methods and apparatus for regulating lasers. More particularly, the present invention relates to methods and apparatus for regulating laser diodes.

2. Description of Related Art

Simulated emission from a GaAs semiconductor diode laser was first observed in the early 1960's. In the intervening years, the semiconductor diode laser (the "laser diode") has come to dominate the laser field in its technological importance. It has become the key element in an increasing number of applications, most notably in optical fiber communication and optical data storage. This "success" is due to the fact that semiconductor lasers can be simply pumped by passing a current through them at voltage and current levels that are compatible with those of integrated circuits, and because they can be modulated directly at frequencies in excess of 20 GHz. Laser diodes can also be conveniently made because they can be mass-produced by the same photolithographic techniques as electronic circuits and because they can be integrated monolithically with those circuits.

Laser diodes are not without shortcomings, however For example, laser diodes typically demonstrate strong non-linear characteristics for variations in operating temperature. Thus, the optical output intensity of a laser diode is difficult to regulate during variations in operating temperature. Laser diodes are also known to present considerable variations of the light power emitted over time, that is, as the laser diodes age.

To moderate the intensity of these variations, it is necessary to provide for regulation of the output light power. Processes are already known for regulating the light power emitted by a laser diode under continuous operating conditions in which an electric signal representative of the light power is compared with an electric reference signal corresponding to a reference power. These processes include means for generating an error signal if appropriate, and for automatically modifying the operating conditions of the laser diode upon generation of such an error signal.

Typically, prior art automatic power controls supply a bias current that is set at approximately the threshold current level of the laser diode. In this manner, when a pulse current is added to the bias current, the laser diode is effectively switched between a high and low optical output intensity corresponding to the wave form of the pulse current. The supplied bias current is controllably varied to be approximately at the threshold current level of the laser diode, particularly when variations in the threshold current level occur because of corresponding variations in the operating temperature of the laser diode.

For clarity and convenience in understanding the foregoing, a typical digital fiber optical communication system and the roles of laser diodes and specific regulators that may be found in such a system will now be discussed.

A typical digital fiber optical communication system has a transmitter at a first end and a receiver ar a second end. Between the transmitter and the receiver are fiber optical contacts, splices, and optical fiber The transmitter is an electro-optical interface which includes an amplifier, laser diode, and some kind of regulation or circuits for keeping the laser diode at the same working point. The receiver is an optoelectrical interface and consists of a photodiode, generally either of the positive-intrinsic-negative ("PIN") or avalanche photo diode ("APD") type, an amplifier and clock recovery circuitry.

It is important in digital optical fiber systems to have as good a power margin as possible. The power margin is the difference between upper and lower optical power limits. These upper and lower optical lower limits are typically set by the receiver. The upper limit is determined by distortion in the amplifier caused by overload. The lower limit, generally called sensitivity, is mainly determined by noise in the front end amplifier.

The upper limit gives the maximum output from the transmitter if there is no damping of the optical signal in the contacts, splices, and fiber. The lower limit tells how much power has to be left after the optical signal from the transmitter has been damped after passing a number of contacts and splices and kilometers of fibers. The upper and lower limits define a power budget. Recognizing that every component in an optical signal path causes some damping or penalty, it should be appreciated that only a limited number of contacts or splices or only a limited length of fiber can be included within any path before the power budget of that path is depleted. This power budget may also be decreased by tolerances in both the transmitter and receiver ends. The tolerance in the transmitter end is determined by quality of regulation of the optical output power. All of the aforementioned relations and penalties are measured in dBm where a penalty or damping first splice is defined as $10 \times \log (P_{in}/P_{out}) dBm$.

As previously mentioned, a laser diode is a nonlinear element and its characteristics are very dependent on working temperature and aging effects. For proper operation, it is necessary to work over the knee of the diode. If work takes place under the knee, the diode will have turn on delay and ringing effects which may be tolerable but only in small amounts. The ratio between maximum and minimum optical output power, the extinction ratio, should be as high as possible but is limited by maximum mean power and maximum turn on delay. Regulation has to adjust the working point as well as possible to compensate for temperature and aging delays, recognizing that any mismatch between the ideal and real values will cause a Penalty that will decrease the power budget.

One of the most common ways to regulate a laser is to have the laser diode work at a constant temperature by a regulated peltier element. Such regulators contain two regulation loops, one for the peltier element and one for the mean power regulation. The output power regulator senses the mean optical output power with the monitor pin diode, and adjusts the bias current to compensate for the by-age increased Ith or threshold current. In such cases changes in scope efficiency are quite small. This kind of regulation works well but is expensive to implement, has a high power consumption (that is, a couple of watts for temperature regulation), requires cooling, and consumes space. Further, the peltier element is not as reliable as the laser diode.

As previously mentioned there are a number of alternative methods to regulate a laser without temperature regulation. One such method is to have only mean power regulation. Such a method has a constant modulation current and a simple regulation of the bias current. This method gives a penalty of 5-6 dBm's for a PIN receiver and more for a APD receiver.

Another method, slightly more complex, is to complement a mean power regulator with a simple feed forward regulator for the modulation current. By sensing the temperature and predicting the modulation currents of the laser diode compensation for variations of slope efficiency can be made. This method is very simple but it requires matching between the sensing element and the characteristics of the laser and does not compensate for aging. This method gives a penalty of a couple of dBm's.

A third method is to regulate mean power as above and also to regulate the modulation power via some kind of low frequency modulated optical power. The optical output power is modulated with a low frequency signal, the amplitude of the signal being 10% or less of the data signal's amplitude so that it can be seen as an low frequency ("LF") ripple on the signal. Modulation can be done via the bias current and causes both maximum and minimum optical values to vary. If such modulation is done completely above the knee these variations would be the same for both maximum and minimum power, but if the bias current is decreased close to the knee or slightly under it, the minimum output power variations will be suppressed. This variation of the LF signal will be registered by the monitor and filtered away and used for regulation together with the mean power signal. This third method has a penalty of approximately a dBm caused by the LF Modulation. Additionally, regulation of this method can only work close to the knee for proper regulation. The optimal working point can at some times be out of this range.

SUMMARY OF THE INVENTION

The present invention overcomes the shortcomings and deficiencies of the prior art by providing an apparatus for controlling the optical output intensity of a laser diode. The apparatus according to the teachings of the present invention includes first means for receiving a portion of the optical output of the laser diode and delivering a first signal having a magnitude representative of the mean output intensity of the laser diode optical output, second means for receiving a portion of the optical output of the laser diode and delivering a second signal having a magnitude representative of the peak output intensity of the laser diode optical output, third means for comparing the magnitude of the first signal to a reference current signal and adjusting the mean output intensity so that it remains substantially constant; and fourth means for comparing the magnitude of the second signal to a reference current signal and adjusting the peak output intensity so that it remains substantially constant.

Embodiments of the present invention may also include structure operable to perform data clocking, such as a D-latch.

The first means and third means effectively form a mean power regulation loop, the second and third means effectively form a peak power regulation loop. In embodiments of the present invention, the mean power regulation loop and the peak power regulation loop may operate with a same predetermined time constant.

In apparatus according to the teachings of the present invention the third means may comprise a modulation regulator and/or the fourth means may comprise a biasing regulator. Additionally, apparatus according to the teachings of the present invention may include a laser and/or data failure alarm. Still further, apparatus according to the teachings of the present invention may include a narrowband channel and a broadband channel.

According to the teachings of the present invention, a method for controlling the optical output intensity of a laser diode used in an optical communication system to periodically transmit data, wherein the laser diode receives current from a pulse current supply and a bias current supply, includes the steps of receiving a portion of the optical output of the laser diode and delivering a first signal having a magnitude representative of the mean output intensity of the laser diode optical output; receiving a portion of the optical output of the laser diode and delivering a second signal having a magnitude representative of the peak output intensity of the laser diode optical output; comparing the magnitude of the first signal to a reference current signal and adjusting the mean output intensity so that it remains substantially constant; and comparing the magnitude of the second signal to a reference current signal and adjusting the peak output intensity so that it remains substantially constant.

Accordingly, it is an object to the present invention to provide a laser driver which is not sensitive to DC imbalance of transmitted data signal.

Another object of the present invention is to provide a laser driver using a relatively small time constant in its regulation loops.

Yet another object of the present invention is to provide a laser driver in which process, temperature and supply variations are suppressed.

Still yet another object of the present invention is to provide a laser driver in which a working point, both under and over biased, can be readily chosen.

BRIEF DESCRIPTION OF THE DRAWINGS

Other objects, advantages, and novel features of the present invention will become apparent from the following detailed description of the invention when considered in conjunction with the accompanying drawings wherein.

DETAILED DESCRIPTION OF THE INVENTION

Figure 1:
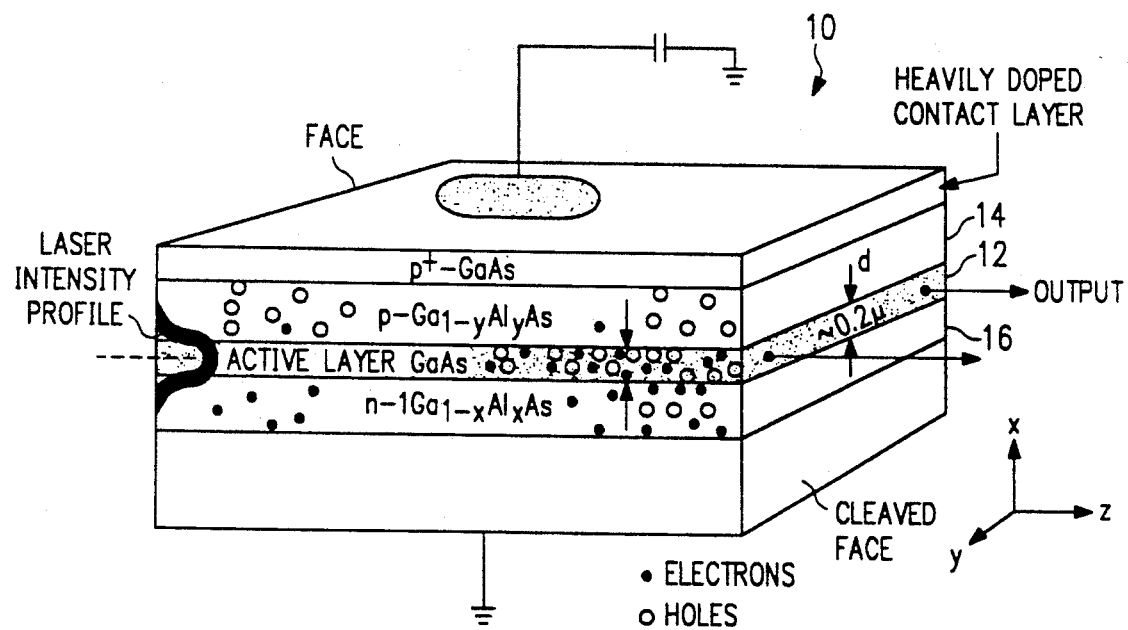
FIG. 1 depicts a typical GaAs/Ga$_{1-x}$Al$_x$As laser.

Referring now to the drawings wherein like or similar elements are designated with identical reference numerals throughout the several views, and more particularly to FIG. 1, there is shown a laser diode 10. Laser diode 10 will be discussed in some detail below to facilitate understanding of the laser diode control method and apparatus of the present invention As is known to those skilled in the art, the high carrier densities needed to obtain gain in semiconductors can be achieved with moderate current densities near the junction region of a p-n diode. The most important class of semiconductor diode lasers are based on III-V semiconductors. One system is based on GaAs and $Ga_{1-x}Al_xAs$. The active region in this case is GaAs or $Ga_{1-x}Al_xAs$. The subscript x indicates the fraction of the Ga atoms in GaAs that are replaced by Al. The resulting lasers emit (depending on the active region molar fraction x and its doping) with a wavelength between about 0.075 and 0.88 microns. This spectral region is convenient for short-haul (<2 km) optical communication in silica fibers.

Figure 2:
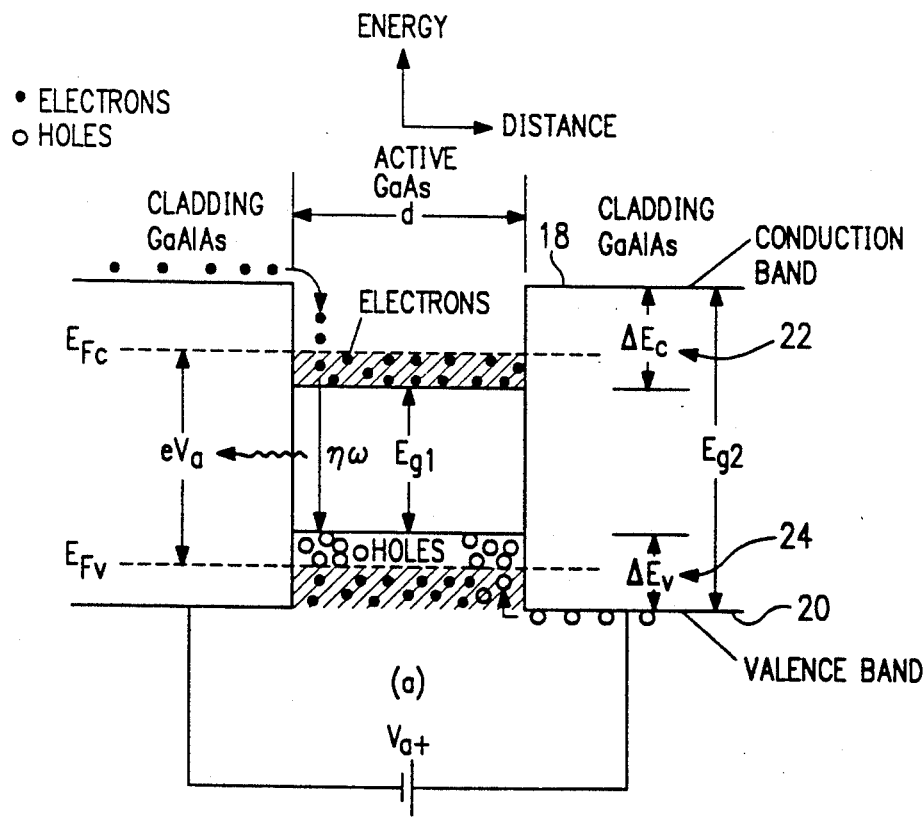
FIG. 2 depicts the conduction and valence band edges under large positive bias in the laser of FIG. 1.
Figure 3:
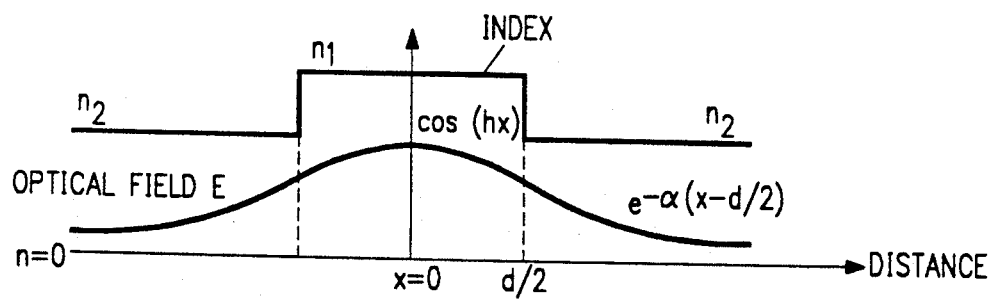
FIG. 3 depicts the index of refraction profile and optical field (fundamental mode) profile relating to FIG. 2.

A second system has $Ga_{1-x}In_xAs_{1-y}P_y$ as its active region. The lasers emit in the 1.1 to 1.6 micron frequency spectral region depending on x and y. The region near 1.55 microns is especially favorable, since optical fibers with losses as small as 0.15 dB/km at this wavelength are available, making it extremely desirable for long-distance high data rate optical communication Referring now specifically to FIG. 1, there is shown a generic GaAs/$Ga_{1-x}Al_xAs$ laser diode 10. This laser diode 10 has a thin (0.1–0.2 micron) region of GaAs 12 that is sandwiched between two regions of $Ga_{1-x}Al_xAs$ of opposite doping 14, 16, thus forming a double heterojunction. The contents of FIG. 2 helps explain the reasons for this structure. FIG. 2, as mentioned in the brief description of the drawings section above, shows the conduction and valence band edges (designated by reference numerals 18 and 20, respectively) in a typical heterojunction diode at full forward bias. A key element in this structure is the formation of a potential well for electrons of height delta $E_c$ 22 that coincides spatially with a well for holes of height delta $E_v$ 24. The energy gap discontinuity is due to its dependence in $Ga_{1-x}Al_xAs$ on the Al molar fraction x. Under forward bias with $e_a \sim E_g$, the large densities of injected electrons (from the n side) and holes (from the p side) in the well cause the inversion condition in that region to be satisfied so that radiation at omega satisfying the equation $E_{Fc} - E_{Fv} <$ h bar (that is, Planck's constant divided by 2 pi) times omega. is amplified in the well. This GaAs inner layer where stimulated emission takes place is called the active region. For maximum gain, it is necessary to confine the light as tightly as possible to the active region since light travelling outside this region does not give rise to stimulated emission, thus not contributing to the gain. This confinement is brought about by a dielectric waveguiding effect due to the fact that a lowering of the energy gap of a semiconductor causes an increase in the index of refraction so that the $Ga_{1-x}Al_xAs$/GaAs/$Ga_{1-x}Al_xAs$ sandwich acts as a dielectric waveguide with the modal energy concentrated in the active region. The index distribution and the modal profile of a typical heterojunction laser is shown in FIG. 3. The index of refraction dependence on x is delta n, which is approximately equal to $-0.7x$.

Figure 4:
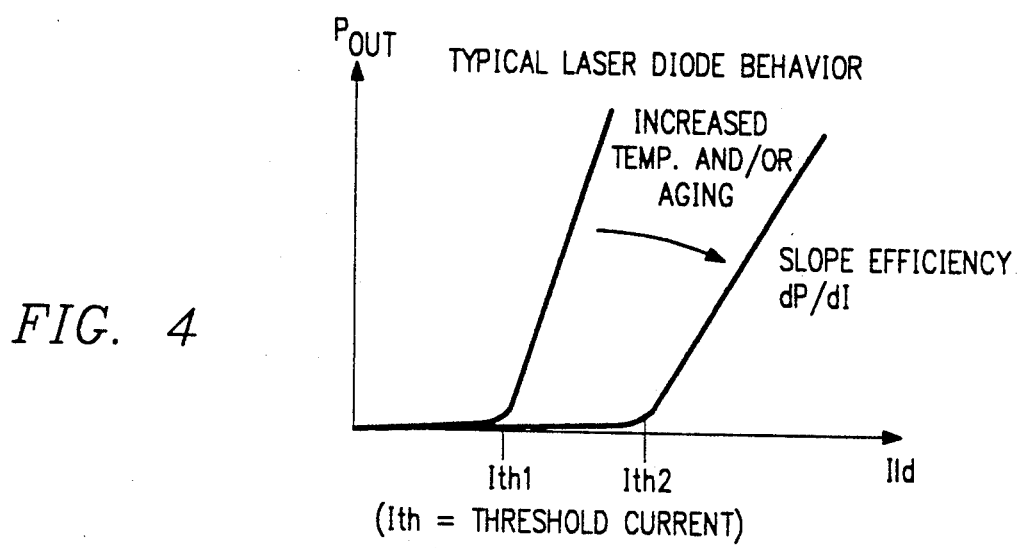
FIG. 4 is a graph illustrating typical laser diode behavior based upon temperature changes and aging.

Referring now to FIG. 4, there is graphically shown typical laser diode behavior, which behavior was discussed in the description of related art section above. FIG. 4 shows that laser diode threshold current increases and slope efficiency (dP/dI) decreases as ambient temperature increases and/or the laser diode ages.

Figure 5:
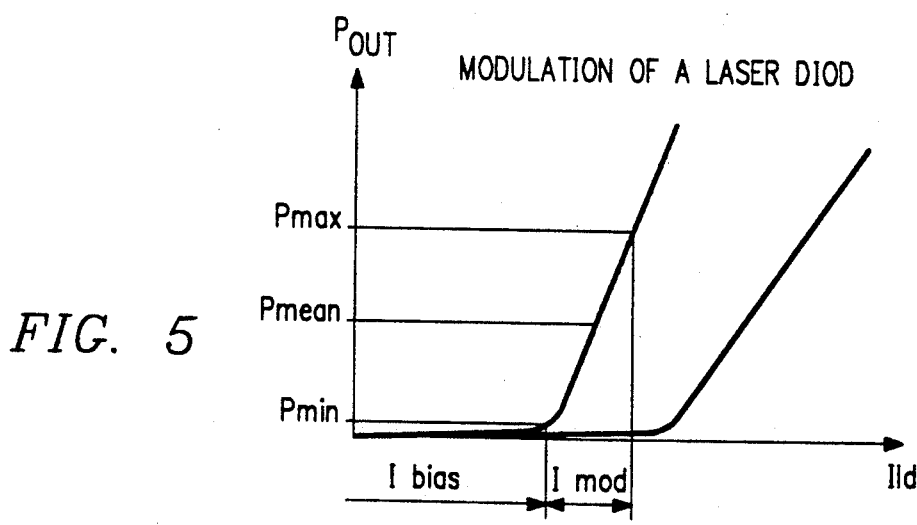
FIG. 5 is a graph illustrating various variables involved in modulating a laser diode.

FIG. 5, as previously mentioned, shows a number of significant variables involved in modulation of a laser diode. In FIG. 5, $I_{bias}$ denotes the bias current and $I_{mod}$ the modulation current. $P_{max}$ is the maximum optical power or peak power. The extinction ratio, also discussed in the description of related art section above, is $P_{max} P_{min}$.

Figure 6:
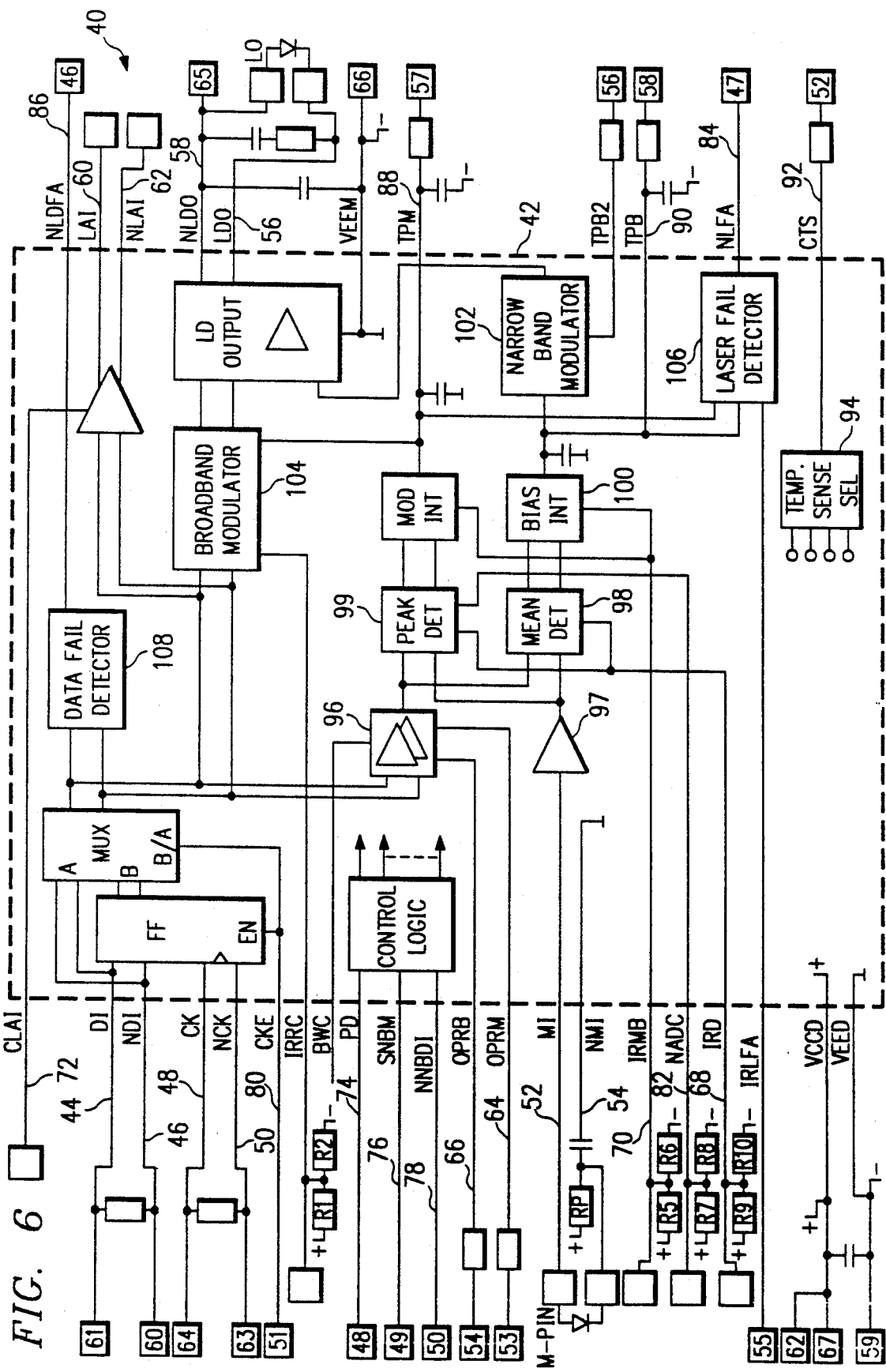
FIG. 6 is a block diagram of a laser driver according to the teachings of the present invention.

Referring now to FIG. 6, there is shown a laser driver 40 according to the teachings of the Present invention. This driver 40 comprises simple hardware relative to prior art drivers and, further, allows integration of a relatively large number of functions on a single chip. Recognizing that dashed line 42 may be considered to designate the boundary of an integrated circuit ("IC"), an IC according to the teachings of the present invention contains, as will be discussed in detail below, high current output stages, control loops, and maintenance performing structure. The driver also features a broadband and a narrowband channel.

With regard to the data/HF interface of the driver 40, data input signals DI/NDI (true/not true, respectively) are shown and represented in FIG. 6 by reference numerals 44 and 46. Likewise, clock input signals CK/NCK (true/not true, respectively) are shown and represented in FIG. 6 by reference numerals 48 and 50 and monitor input MI/NMI (with max input current being 1 mA) are shown and represented in FIG. 6 by reference numerals 52 and 54. Data/HF interface output comprises laser diode output signal LDO, laser diode output inverted signal NLDO, and maintenance loop A1 true and inverted outputs LA1 and NLA1. The foregoing output signals are shown and represented in FIG. 6 by reference numerals 56, 58, 60 and 62, respectively.

With respect to control and Y-interface signals, there are two basic analog input signals to driver 40. They are the optical power reference for modulation signal OPRM and the optical power for biasing signal OPRB. The OPRM signal provides a reference input for adjusting the modulation value of the optical output power, that is, the level difference between optical '1' and optical '0'. The OPRB signal, on the other hand, provides a reference input for adjusting the mean value of the optical output power. The OPRM signal and the OPRB signal are shown and represented in FIG. 6 by reference numbers 64 and 66, respectively.

There are a number of extra inputs to the driver circuit 40. Generally, these inputs are for testing purposes. Via these inputs, the values of internal references may be changed. All of the internal references within the driver circuit 40 have their own default values; however, these defaults can be changed if desired by adding an external reference current.

Every internal reference source with an external reference input works in the same way If an external reference input is low (e.g., lower than −4 V), the default value is used. If a current is applied to the input it will go high (e g., over −4 V). This will effectively turn off the internal reference source and effect a mirroring of the external current for use as new internal reference.

Four of the aforementioned extra inputs are SRC1, SCR2, IRD, and IRMB. SRC1 and SRC2 may be connected to the Y-interface and may be adjusted externally outside the TR-module if necessary. SRC1 and SRC2 are effectively for slew rate control. SRC1 and SRC2 provide reference input for controlling the positive and negative slope of the laser output signal to optimize the signal for each implementation if the default values are not sufficient. It is not necessary to connect the SRC1 and SRC2 signals directly to the Y-interface and those signals can be adjusted directly on the TR module. The default value for SRC1 can be about 100 uA. The default value of SRC2 can be about 0.4% of the modulator current.

It is important to note that the SRC1 and SRC2 signals discussed in the immediately preceding paragraph merely constitute certain aspects of certain embodiments of the present invention. Other embodiments of the present invention, which embodiments lack SRC1 and/or SRC2 signals and/or those signals as described hereinabove, are possible. For example, in an embodiment of the present invention which has been actually constructed, the signals SRC1 and SRC2 described above have been replaced with a single signal designated IRRC, which signal performs the SRC1 and SRC2 functions described above. Such modifications should be appreciated and understood to be aspects of the present invention within the scope of the appended claims.

The IRD and IRMB signals can only be adjusted internally on the submodule. The IRD signal provides a reference input for the current and the detector circuit. Default value for an IRD signal can be about 10 uA. The IRMB signal provides a reference input for the current in the integrator circuits, mod reg and bias reg. A typical default value for an IRMB signal may be about 10 uA.

FC1 and FC2 are frequency compensation connections. These connections are for compensation of the slow monitor PIN diode. The peak value of the monitor signal will be dependent upon the frequency spectrum in the data signal. This causes a dependence in the optical output level when alternating between different frequency spectras around or over the bandwidth of the monitor PIN diode. This dependence can partially be compensated for by connecting an inductor between FC1 and FC2. An example value of this inductor could be about 50 nH. This compensation can also be omitted during the manufacturing process or by simply connecting a jumper between the two pads.

An alternative solution has been implemented by the inventor of the present invention for this bandwidth compensation. An extra input, BWC (bandwidth control), may be added to the circuit. This input can control the bandwidth of the data reference signal through the amplifier 96 so that the output signal from the circuit 96 will almost look the same as the output signal from the monitor amplifier 97. This function can increase the usable bandwidth region for the circuit which leads to a proper regulation even if there is a bandwidth limitation in the monitor diode.

With respect to digital input, there are a number of signals appropriately mentioned. In this discussion, CMOS levels referred to are negative 5 volts so that high or H is equal to 0 volts and low or L is equal to negative 5 volts. The closed loop Al or CLAl signal 72 closes the loop Al by enabling the loop Al output. H is equal to loop Al connected. Power down or PD signal 74 is a power down command input. For this PD signal high is equal to power down. The select narrow band mode or SNBM signal 76 sets the laser driver 40 in a narrow band traffic mode. For this signal high is equal to enabled. The narrow band data input or NNBDI signal 78 is a negative narrow band data input when the laser driver works in the narrow band traffic mode CMOS levels refer to negative 5 volts, inverted. High on the input gives no optical output power. For the aforementioned PD, SNBM and NNBDI signals in a driver 40 according to the teachings of the present invention, the following truth table may be employed;

| TRUTH TABLE | | | |
|---|---|---|---|
| PD | SNBM | NNBDI | |
| H | L | X | Power down mode |
| H | H | X | Narrow band operating mode |
| L | X | X | Broad band operating mode |

The clock enable or CKE signal 80 enables clocking of the data signal. For the CKE signal high is equal to clocked data. An NADC signal 82 adds extra capacitance to the peak detector in the detector circuit if necessary Low gives extra capacitance. This is connected by a jumper on the subcarrier.

Two digital output signals are a negative laser fail alarm or NLFA signal 84 and a negative laser data fail alarm NLDFA signal 86. The NLFA signal 84 alarms if there is no optical power detected in the monitor. For this signal, low is equal to alarm. The NLDFA signal 86 alarms when there is no current data on the data input. For this signal, low means alarm.

Driver 40 has five test Points situated close to the driver chip for testing of internal signals in connecting external compensation components. These five test points are designated TPM, TPB, CTS, TP1 and TP2. The TPM test point 88 is for test point modulation. The TPB test point 90 is for test point bias. TPM and TPB are for regulating voltages. It is possible to override this inherent regulation by forcing these test points, which allows external regulation of the optical signal. External capacitors can also be connected to these test points if it is necessary to increase the time constants in the integrators. The CTS test point 92 relates to chip temperature. A temperature sensing component 94 is associated with this test point 92. In embodiments of the laser driver 40 of the present invention, a number of temperature sensors can be placed at different places on the chip. These sensors can be selected one at a time and connected to the output CTS. These sensors may be selected by the signals NNBDI and SNBM. TP1 and TP2 are optional test points.

With respect to function, the laser diode driver 40 consists of six parts: a data clocking and signal path, a modulation regulator, a biasing regulator, a modulator, a supervisory part, and a part for low power bit rate reduced traffic, that is, narrow band traffic at about 200 kilobits per second. In general, in embodiments of the present invention narrowband modulation works to a range from 0 up to some number of M/bits/s and broadband modulation works from Mbits/s up to Gbits/s. Each of these parts will be described in individual paragraphs immediately below.

The data clocking and signal Path comprises a D-larch for clocking of the input data. This path further comprises a driver for an extra output, that is, loop Al output. The extra output is enabled by a control signal. In general, this path handles internal distribution of data. In embodiments of the present invention, the D-latch itself can be bypassed by a control signal.

The modulation regulator comprises the modulation current regulator. In this part the optical '1' level is detected by a monitor diode and compared with the "OPRM" reference signal. This comparison is done in element 99 and it effectively determines the optical amplitude, optical '1' - optical '0', on the laser diode's P/I transfer curve. In embodiments of the present invention, the modulation is always adjusted so that the optical amplitude power level remains constant. The functions performed by this part effectively compensate for variations in the external differential efficiency of the laser diode due to temperature and aging effects.

The biasing regulator part of the laser driver 40 comprises a biasing current regulator. In this Part the optical mean level is detected by the monitor diode and compared with the "OPRB" reference signal. By means to this regulator, specifically elements 98 and 100 shown in FIG. 6, the bias current from the laser driver circuit is regulated together with the modulation current so that the optical '0' output power is always constant. The functions performed by this part effectively compensate for variations of the threshold current due to aging and temperature variations. This part and the modulation part 102 together hold the optical output power levels for the '0' and '1' constant and independent of ambient temperature, supply voltage variations, aging effects of the laser diode, and the like.

The comparison effected within this portion of a laser driver according to the teachings of the present invention constitutes a significant advance over the prior art and a matter of particular interest to those skilled in the relevant art. In general, a comparison is made between the "data voltage reference" and the "monitor voltage reference". More specifically, a comparison between the peak values and mean values, respectively, is made for those two voltages.

Continuing the discussion immediately above, it should be appreciated that the method by which the two voltages are created causes them to be electrically equal. Thus, modulator 96 and monitor front end 97 (see FIG. 6) provide a symmetric balance. Summarizing the foregoing, it may be said that the two reference currents control a modulator 96 that modulates the data signal to an internal reference voltage. The monitor current converrs in a monitor front end 97 to a monitor voltage. Accordingly, the two reference currents mirror the mean and peak current in the monitor current and the data signal mirrors the data pattern in the monitor signal.

The modulator comprises the output laser driver stages and an adjustable modulation controlling circuit. Elements 102 and 104 shown in FIG. 6 form part of this modulation. The adjustable modulation controlling circuit controls the positive and negative slope of the laser diode output. Rise and fall time of the signal can be adjusted to optimize the signal for the laser diode and for the connections between the driver and a Laser associated therewith. This facility allows partial reduction of the penalty caused by mismatch in laser diode connections, which connections differ in different implementations.

The supervisory part of the laser driver performs two supervisory functions. One such function is a laser failure alarm. This alarm 106 activates in the event of a failure in a laser or a monitor. The alarm circuit senses the two regulation voltages TPB and TPM and if one or both are stuck to the limiting power supply rails for the circuit that will indicate that the regulation is out of order and, in turn, that the laser is out of order. At that point, the output alarm may and should be triggered. The second function is a data failure alarm. This alarm 108 activates when there is no current data to transmit on the data input.

The low power/narrow band traffic portion of the laser driver 40 handles low power bit rate reduced traffic. The narrow band has a bit rate of from 0 to some Mbits/s. The ISDN U-interface for 2B+D has a bit rate of 160 kilobits per second. Power is saved by using a low bandwidth and a modified modulation method of the laser. Typically, a laser works by being completely on or completely off. When optical 1's are transmitted the laser works as usual with the same power level as determined by the "OPRB" and "OPRM" references. When optical 0's are transmitted the bias is turned off. In such a case, the incoming narrow band data stream modulates the Laser directly. Power dissipation is also decreased by using bi-phase coding and by shortening the pulses. The narrow band part uses the bias current stage to modulate the laser rather than the modulator 104.

From the foregoing description and the accompanying drawings, it may gathered that the laser driver of the present invention relies upon a bipolar-CMOS process. The process of the present invention is generally intended for digital applications. More specifically, a laser driver chip serves as an interface between an electrical path and a laser diode. The laser driver chip according to the teachings of the present invention may be used in other, similar applications.

By way of example only, set forth below are recommended operating conditions, electrical characteristics, and control signal/Y-interface signals for one embodiment of the present invention.

| Recommended Operating Conditions | | | |
|---|---|---|---|
| Power supply | min 4.5 V | nom 5.0 v | max 5.3 V |
| Current | | | max 200 mA |
| Operating temperature | 0–70 C. | | |

| Electrical Characteristics | |
|---|---|
| Data/HF Interface | |
| All values are referred to 0 and −5 V supply voltage. | |
| Data/Clock input | |
| min input level peak to peak | 100 mV |
| common mode range −3 - | −0.3 V |
| max input current (sinking) | 10 uA |
| capacitive load max | 2 pF |
| Data output (LAI) | |
| Terminating load 150 ohm, max capacitive load 5 pF | |
| min output level peak to peak | 200 mV |
| output range min − max −1.4 - | −0.9 V |
| max rise and fall time (10–90%) | 0.8 nS |
| Monitor input | |
| max current from NMI to MI | 1. mA |
| voltage level of MI −4.2 - | −4.0 V |
| voltage level of NMI | 0.0 V |
| Laser diode output, LDO | |
| max modulation current, Im | 50 mA |
| max bias current, Ib | 100 mA |
| max modulation current in narrowband operation Imn | 100 mA |
| Laser diode output negative, NLDO max modulation current | 50 mA |
| Control Signals/Y-Interface Signals | |
| Analog input | |
| OPRM modulation reference current input | 1 mA |
| reference current 0.1 - | 0 V |
| voltage level −4.2 - | 0 V |
| OPRB bias reference current input | |
| reference current 0.1 - | 1 mA |
| voltage level −4.2 - | 0 V |
| SRC1/SRC2, external reference input for controlling slopes in output signal to the LD is necessary. | |

-continued

| Disabled, voltage level lower than −4 V |

Those skilled in the art should now appreciate that the laser driver according to the teachings of the present invention effects comparison between real values from a monitor diode and desired values from an internal network. These two data paths are virtually identical. The means current and peak current for the monitor is mirrored by the two external reference currents OPRB and OPRM. The data signals from the monitor amplifier and the data amplifier look the same. All of the foregoing give rise to a number of advantages. One such advantage is suppression of pattern variations. The circuit according to the teachings of the present invention is not sensitive to DC imbalance of the transmitted data signal. Furthermore, the comparison between two almost identical signals allows for reduction in the time constant in the loops. Still further, the two regulator loops, the peak power and the mean power, modulator and bias, cooperate. Their time constants can be the same. This is opposed to other systems in which a difference of 5 to 10 times is necessary. Still further, an almost perfect symmetry in operation suppresses process, temperature and supply variations. The laser driver of the present invention effects very accurate regulation. Mean and peak regulation allows choosing desired working point under and over bias.

Obviously, numerous modifications and variations are possible in light of the above teachings. For example, while the specific embodiment of the present invention described herein is made for a digital data stream, an embodiment of the present invention could also be made for an analog application where the data stream is a sinusoidal signal which is frequency modulated, phased modulated, or modulated in some other way. As another example, the inventor of the present invention has chosen a mean and peak combination (Note: there are three different detectors for measuring two points on the P/I curve for the laser diode, valley-, mean- or peak-detector, and there are three possibilities for combining these detectors; valley and mean, valley and peak, or mean and peak) herein because mean detection is simple and accurate and if peak detection does not work there should be at least a working mean power regulation. Those skilled in the art should appreciate, however, that the mean detector may be replaced with a minimum peak or valley detector in laser control apparatus. In fact, such a valley and peak combination would probably give a very accurate regulation if the P/I curve for the laser diode is bent and the radius of the bend is temperature dependent (which happens with some laser diodes, especially when there is a high driving current and high temperature). From the circuit's point of view, there is a very simple way to effect these changes. That is, to substitute the detectors to the preferred combination, with the first detector as block 98 and the second as block 99. When such detector blocks are used, of course, valley value insread of mean value will be detected. Functionally, however, everything, including the rest of the circuit, will remain the same. Other changes and variations leading to other embodiments of the present invention are possible. Accordingly, within the scope of the appended claims, the present invention may be practiced otherwise than as specifically described herein.

What is claimed is:

1. An apparatus for controlling the optical output intensity of a laser diode used in an optical communication system to periodically transmit dara, wherein said laser diode receives current from a pulse current supply and a bias current supply, said apparatus comprising:
   first means for receiving a portion of the optical output of said laser diode and delivering a first signal having a magnitude representative of the mean output intensity of said laser diode optical output;
   second means for receiving a portion of the optical output of said laser diode and delivering a second signal having a magnitude representative of the peak output intensity of said laser diode optical output;
   third means for comparing the magnitude of the first signal to a reference current signal and adjusting the mean output intensity so that it remains substantially constant; and
   fourth means for comparing the magnitude of the second signal to a reterence current signal and adjusting the peak output intensity so that it remains substantially constant wherein said first means and said third means form part of a mean power regulation loop, wherein said second means and said forth means form part of a peak power regulation loop, wherein said mean power regulator loop and said peak power regulator loop operate with a same predetermined time constant.

2. An apparatus as recited in claim 1, further comprising structure operable to perform data clocking.

3. An apparatus as recited in claim 1, wherein said third means comprises a modulation regulator.

4. An apparatus as recited in claim 1, wherein said fourth means comprises a biasing regulator.

5. An apparatus as recited in claim 1, further comprising a laser failure alarm.

6. An apparatus as recited in claim 1, further comprising a data failure alarm.

7. An apparatus as recited in claim 1, wherein said apparatus comprises a narrowband channel and a broadband channel.

8. A method for controlling the optical output intensity of a laser diode used in an optical communication system to periodically transmit data, wherein said laser diode receives current from a pulse current supply and a bias current supply, said method comprising the steps of:
   receiving a portion of the optical output of said laser diode and delivering a first signal having a magnitude representative of the mean output intensity of said laser diode optical output;
   receiving a portion of the optical output of said laser diode and delivering a second signal having a magnitude representative of the peak output intensity of said laser diode optical output;
   comparing the magnitude of the first signal to a reference current signal and adjusting the mean output intensity so that it remains substantially constant; and
   comparing the magnitude of the second signal to a reference current signal and adjusting the peak output intensity so that it remains substantially constant wherein said first means and said third means form part of a mean power regulation loop; wherein said second means and said fourth means form part of a peak power regulation loop; wherein said step of performing data clocking involves use of a predetermined time constant; and wherein said means power regulator loop and said peak power regulation loop operate with said predetermined time constant.

9. A method as recited in claim 8, further comprising the step of performing data clocking.

10. A method as recited in claim 8, wherein said third means comprises a modulation regulator.

11. A method as recited in claim 8, wherein said fourth means comprises a biasing regulator.

12. A method as recited in claim 8, further comprising the step of triggering an alarm where said laser diode fails.

13. A method as recited in claim 8, further comprising the step of triggering an alarm when said data fails.

14. A method as recited in claim 8, wherein said method comprises a narrowband channel and a broadband channel.

* * * * *